(12) United States Patent
Shtein et al.

(10) Patent No.: US 6,734,038 B2
(45) Date of Patent: May 11, 2004

(54) METHOD OF MANUFACTURING HIGH-MOBILITY ORGANIC THIN FILMS USING ORGANIC VAPOR PHASE DEPOSITION

(75) Inventors: Max Shtein, Princeton, NJ (US); Stephen R. Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/946,372

(22) Filed: Sep. 4, 2001

(65) Prior Publication Data

US 2003/0054586 A1 Mar. 20, 2003

(51) Int. Cl.$^7$ .......................... H01L 51/40; H01L 21/00; H01L 21/31

(52) U.S. Cl. .......................... 438/99; 438/97; 438/149; 438/82; 438/780

(58) Field of Search .......................... 438/149, 82, 97, 438/99, 166, 488, 584, 585, 780, 781

(56) References Cited

U.S. PATENT DOCUMENTS

| | | | | |
|---|---|---|---|---|
| 5,402,748 A | * | 4/1995 | Takai et al. | 117/84 |
| 5,468,519 A | * | 11/1995 | Akiyama et al. | 427/532 |
| 5,554,220 A | | 9/1996 | Forrest et al. | |
| 5,736,073 A | * | 4/1998 | Wadley et al. | 264/10 |
| 5,953,828 A | * | 9/1999 | Hillman | 34/74 |
| 6,207,239 B1 | * | 3/2001 | Affinito | 427/488 |
| 6,232,157 B1 | * | 5/2001 | Dodabalapur et al. | 438/158 |
| 6,278,127 B1 | | 8/2001 | Dodabalapur et al. | |
| 6,326,640 B1 | * | 12/2001 | Shi et al. | 257/40 |
| 6,337,102 B1 | * | 1/2002 | Forrest et al. | |
| 6,664,137 B2 | * | 12/2003 | Weaver | 438/125 |
| 2003/0056720 A1 | * | 3/2003 | Dauelsberg et al. | 117/200 |

OTHER PUBLICATIONS

S.R. Forrest, "Ultrathin Organic films grown by organic molecular beam deposition and related techniques", *Chem. Rev.* vol. 97, No. 6, pp. 1793–1896 (Sep./Oct. 1997).

M. A. Baldo, et al., "Organic Vapor Phase Deposition", *Adv. Mater.* 10, No. 18, pp. 1505–1514 (1998).

P. E. Burrows, et al., "Organic Vapor Phase Deposition: a new method for the growth of organic thin films with large optical non–linearities", *J. Cryst. Growth* 156, pp. 91–98 (1995).

K. M. Vaeth, et al., "Chemical vapor deposition of poly (p–phenylene vinylene) based light emitting diodes with low turn–on voltages", *Appl. Phys. Lett.* 71 (15), pp. 2091–2093 (Oct. 13, 1997).

M. A. Baldo, et al., "Low pressure organic vapor phase deposition of small molecular weight organic light emitting device structures", *Appl. Phys. Lett.* 71(21), pp. 3033–3035 (Nov. 24, 1997).

M. Shtein, et al., "Material transport regimes and mechanisms for growth of molecular organic thin films using low–pressure organic vapor phase deposition", *J. Appl. Phys.* 89:2, pp. 1470–1476 (Jan. 15, 2001).

(List continued on next page.)

*Primary Examiner*—John F. Niebling
*Assistant Examiner*—Stanetta Isaac
(74) *Attorney, Agent, or Firm*—Kenyon & Kenyon

(57) ABSTRACT

A method of employing organic vapor phase deposition to fabricate a polycrystalline organic thin film is described. By employing organic vapor phase deposition at moderate deposition chamber pressures and substrate temperatures, a polycrystalline organic thin film results having significantly larger purity and grain size than what is achievable by vacuum thermal evaporation. These polycrystalline organic thin films may be employed in a variety of applications, including, for example, organic light emitting devices, photovoltaic cells, photodetectors, lasers, and thin film transistors.

47 Claims, 10 Drawing Sheets

OTHER PUBLICATIONS

G. Horowitz, *J. Mater. Chem.*, 9, pp. 2021–2026 (1999).

A.R. Brown, et al., "Field–effect transistors made from solution–processed organic semiconductors", *Synth. Met.* 88, pp. 37–55 (1997).

C.D. Dimitrakopoulos, et al., "Molecular beam deposited thin films of pentacene for organic filed effect transistor applications", *J. of Appl. Phys.* 80(4), pp. 2501–2508 (Aug. 15, 1996).

D.J. Gundlach, et al., "Pentacene organic thin–film transistors– molecular ordering and mobility", *IEEE El. Dev. Lett* vol. 18, No. 3, pp. 87–89 (Mar. 3, 1997).

J.H. Schön, et al., "Ambipolar pentacene field–effect transistors and inverters", *Science* 287 pp. 1022–1023 (Feb. 11, 2000).

J.H. Schön, et al., "On the intrinsic limits of pentacene field–effect transistors", *Organic Electronics* 1, pp. 57–64 (2000).

Y.Y. Lin, et al., "Pentacene–based organic thin–film transistors", *IEEE Trans. On El. Dev.* vol. 44, No. 8, pp. 1325–1331 (Aug. 8, 1997).

D.J. Gundlach, et al., "High–mobility, low voltage organic thin film transistors", *International Electron Devices Meeting Technical Digest*, Dec. 1999, pp. 111–114.

Ch. Kloc, et al., "Physical vapor growth of centimeter–sized crystals of α–hexathiophene", *J. of Crystal Growth* 182, pp. 416–427 (1997).

J.H. Schön, et al., "An organic solid state injection laser", *Science* 289, pp. 599–601 (Jul. 28, 2000).

J.H. Schön, et al., "Electrical properties of single crystasl of rigid rodlike conjugated molecules", *Phys. Rev. B* 58, No. 19, pp. 12952–12957 (Nov. 15, 1998).

S.F. Nelson, et al., "Temperature–independent transport in high–mobility pentacene transistors", *Appl. Phys. Lett.* vol. 72, No. 15 pp. 1854–1856 (Apr. 13, 1998).

G. Horowitz, et al., "Mobility in Polycrystalline Oligothiophene Field–effect transistors dependent on grain size", *Adv. Mater.* 2000, 12, No. 14, pp. 1046–1050 (Jul. 19, 2000).

T.N. Jackson, et al., "Organic thin–film transistors for organic light–emitting flat–panel display backplanes", *IEEE J. of Sel. Topics in Quant. Electr.* vol. 4, No. 1, pp. 100–104 (Jan./Feb. 1998).

I.P.M. Bouchoms, et al., "Morphology identification of the thin film phases of vacuum evaporated pentacene on SIO2 substrates", *Synth. Met.* 104, pp. 175–178 (1999).

C. D. Dimitrakopoulos, et al., "Organic thin–film transistors: a review of recent advances",*IBM J. Res. & Dev.* vol. 45, No.1, pp. 11–27 (Jan. 2001).

\* cited by examiner

METHOD OF MANUFACTURING HIGH-MOBILITY ORGANIC THIN FILMS USING ORGANIC VAPOR PHASE DEPOSITION

GOVERNMENT RIGHTS

This invention was made with Government support under Contract No. DMR94–00362 awarded by NSF/MRSEC. The government has certain rights in this invention.

FIELD OF THE INVENTION

The present invention is directed to a method of fabricating organic thin films employing the technique of organic vapor phase deposition to form a highly ordered polycrystalline organic thin film.

BACKGROUND OF THE INVENTION

Molecular organic compounds are employed as active materials in a variety of applications, including organic light emitting diodes (OLEDs), photovoltaic cells, photodetectors, lasers, and thin film transistors. Typically, these thin (~100 nm) film devices are grown by thermal evaporation in high vacuum, permitting the high degree of purity and structural control needed for reliable and efficient operation (see S. R. Forrest, Chem. Rev. 97, 1793 (1997)). However, control of film thickness uniformity and dopant concentrations over large areas needed for manufactured products can be difficult when using vacuum evaporation (see S. Wolf and R. N. Tauber, Silicon Processing for the VLSI Era (Lattice, 1986)). In addition, a considerable fraction of the evaporant coats the cold walls of the deposition chamber; over time, inefficient materials use results in a thick coating which can flake off, leading to particulate contamination of the system and substrate. The potential throughput for vacuum-evaporated organic thin film devices is low, resulting in high production costs. In past work (see M. A. Baldo, M. Deutsch, P. E. Burrows, H. Gossenberger, M. Gerstenberg, V. S. Ban, and S. R. Forrest, Adv. Mater. 10, 1505 (1998)), low-pressure organic vapor phase deposition (LP-OVPD) has been demonstrated as an alternative technique that improves control over doping, and is adaptable to rapid, particle-free, uniform deposition of organics on large-area substrates.

Organic vapor phase deposition (OVPD) is similar to hydride vapor phase epitaxy used in the growth of III–V semiconductors (see G. B. Stringfellow, Organometallic Vapor-Phase Epitaxy (Academic, London, 1989); G. H. Olsen, in GaInAsP, edited by T. P. Pearsall (Wiley, N.Y., 1982)). In LP-OVPD, the organic compound is thermally evaporated and then transported in a hot-walled reactor by an inert carrier gas toward a cooled substrate where condensation occurs. Flow patterns may be engineered to achieve a substrate-selective, uniform distribution of organic vapors, resulting in a very uniform coating thickness and minimized materials waste. Using atmospheric pressure OVPD, Burrows et al. (see P. E. Burrows, S. R. Forrest, L. S. Sapochak, J. Schwartz, P. Fenter, T. Buma, V. S. Ban, and J. L. Forrest, J. Cryst. Growth 156, 91 (1995)) first synthesized a nonlinear optical organic salt 4'-dimethylamino-N-methyl-4-stilbazolium tosylate. In a variation on this method, Vaeth and Jensen (see K. M. Vaeth and K. Jensen, Appl. Phys. Lett. 71, 2091 (1997)) used nitrogen to transport vapors of an aromatic precursor, which was polymerized on the substrate to yield films of poly (s-phenylene vinylene), a light-emitting polymer. Recently, Baldo and co-workers (see M. A. Baldo, V. G. Kozlov, P. E. Burrows, S. R. Forrest, V. S. Ban, B. Koene, and M. E. Thompson, Appl. Phys. Lett. 71, 3033 (1997)) have demonstrated apparently the first LP-OVPD growth of a heterostructure OLED consisting of N,N-di-(3-methylphenyl)-N,N diphenyl-4,4-diaminobiphenyl and aluminum tris(8-hydroxyquinoline) (Alq$_3$), as well as an optically pumped organic laser consisting of rhodamine 6G doped into Alq$_3$. More recently, Shtein et al have determined the physical mechanisms controlling the growth of amorphous organic thin films by the process of LP-OVPD (see M. Shtein, H. F. Gossenberger, J. B. Benziger, and S. R. Forrest, J. Appl. Phys. 89:2, 1470 (2001)).

Virtually all of the organic materials used in thin film devices have sufficiently high vapor pressures to be evaporated at temperatures below 400° C. and then transported in the vapor phase by a carrier gas such as argon or nitrogen. This allows for positioning of evaporation sources outside of the reactor tube (as in the case of metalorganic chemical vapor deposition (see S. Wolf and R. N. Tauber, Silicon Processing for the VLSI Era (Lattice, 1986); G. B. Stringfellow, Organometallic Vapor-Phase Epitaxy (Academic, London, 1989)), spatially separating the functions of evaporation and transport, thus leading to precise control over the deposition process.

As mentioned above, one type of device which employs organic thin films is a thin film field effect transistor. Thin film field effect transistors employing organic channels, for application to organic electronic circuits such as display back panels, have been made using a wide range of compounds. To date, pentacene-containing devices exhibit the highest mobilities and other favorable characteristics for thin film transistor ("TFT") applications. See G. Horowitz, J. Mater. Chem., 9 2021 (1999). The channel layers have been deposited by several techniques including solution processing (see A. R. Brown, C. P. Jarrett, D. M. deLeeuw, M. Matters, Synth. Met. 88 37 (1997)), ultrahigh vacuum organic molecular beam deposition ("OMBD")(see C. D. Dimitrakopoulos, A. R. Brown, A. Pomp, J. of Appl. Phys. 80 2501 (1996)), high vacuum deposition (see D. J. Gundlach, Y. Y. Lin, T. N. Jackson, S. F. Nelson, D. G. Schlom, IEEE El. Dev. Lett 18 87 (1997)), vapor phase growth of single crystals (see J. H. Schön, S. Berg, Ch. Kloc, B. Batlogg, Science 287 1022 (2000)), and finally, organic vapor phase deposition ("OVPD") (see P. E. Burrows, S. R. Forrest, L. S. Sapochak, et al., J. of Crystal Growth 156 91 (1995); M. Shtein, H. F. Gossenberger, J. B. Benziger, S. R. Forrest, J. of Appl. Phys. 89 1470 (2001); and J. H. Schön, Ch. Kloc, B. Batlogg, Organic Electronics 1 57 (2000)).

It has been shown that the performance characteristics of organic crystalline field effect transistors, such as mobility and on/off ratio, are significantly higher in single crystals (see J. H. Schön, S. Berg, Ch. Kloc, B. Batlogg, Science 287 1022 (2000)) than in polycrystalline thin films deposited by vacuum (see Y. Y. Lin, D. J. Gundlach, T. N. Jackson, S. F. Nelson, IEEE Trans. On El. Dev. 44 1325 (1997); D. J. Gundlach, H. Klauk, C. D. Sheraw, C. C. Kuo, J. R. Huang, T. N. Jackson, International Electron Devices Meeting Technical Digest, December 1999, 111–114), flash evaporation, or solution precipitation. It has also been demonstrated that purification by train sublimation at moderate pressures (ca. 760 Torr) and in reducing atmospheres (for example, H$_2$) results in larger and more chemically pure organic crystals with lower trap densities than conventional vacuum train sublimation (ca. 10$^{-5}$ Torr) (see Ch. Kloc, P. G. Simpkins, T. Siegrist, R. A. Laudise, J. of Crystal Growth 182 416 (1997)). Although the mobility is highest in single crystals, practical field effect transistors require the deposition of the active layers onto substrates.

Specifically, pentacene TFTs made by solution precipitation and OMBD have an effective channel hole mobility, $\mu_{eff}$, of about 0.04 cm$^2$/V·s at room temperature, and are typically the lowest of the described techniques. Large (ca. 0.5 cm) single crystals of compounds such as α-hexithiophene (α-6T) (see Ch. Kloc, P. G. Simpkins, T. Siegrist, R. A.

Laudise, *J. of Crystal Growth* 182 416 (1997)), tetracene (see J. H. Schön, Ch. Kloc, A. Dodabalapur, B. Batlogg, *Science* 289 599 (2000)), and pentacene (see J. H. Schön, Ch. Kloc, R. A. Laudise, B. Batlogg, *Phys. Rev.* B 58 12952 (1998)) have been grown in inert and reducing atmospheres, with the metal contacts and gate insulators deposited onto the free-standing crystals. These devices have yielded the highest mobilities of 1.3 and 2.7 cm$^2$/V·s at room temperature for electrons and holes, respectively (see J. H. Schön, Ch. Kloc, R. A. Laudise, B. Batlogg, *Phys. Rev.* B 58 12952 (1998)). A more practical technique for TFT fabrication uses vacuum thermal deposition of pentacene films onto the gate insulator followed by evaporation of the source and drain contacts through a shadow mask. The resulting pentacene crystallite size is typically <1 μm, while using a shadow mask limits the minimum channel length to about 15 μm. With the channel considerably longer than the average pentacene grain size, the resulting mobility is typically between 0.1 and 0.5 cm$^2$/V·s (see Y. Y. Lin, D. J. Gundlach, T. N. Jackson, S. F. Nelson, *IEEE Trans. On El. Dev.* 44 1325 (1997); and S. F. Nelson, Y. Y. Lin, D. J. Gundlach, T. N. Jackson, *Appl. Phys. Lett.* 72 1854 (1998)). For increased ease of integration with established technologies, and also to decrease the channel length, TFTs have been made with source and drain contacts pre-patterned by photolithography followed by vacuum deposition of the pentacene channel. However, in that case, $\mu_{eff}$ equals about 0.1 cm$^2$/V·s, despite the shorter channel length (see S. F. Nelson, Y. Y. Lin, D. J. Gundlach, T. N. Jackson, *Appl. Phys. Lett.* 72 1854 (1998)).

Mobility has been reported to depend on the substrate temperature during deposition, which controls the size and connectivity of individual grains of the deposited polycrystalline thin film (see G. Horowitz and M. E. Hajlaoui, *Adv. Mater.* 2000 12 (1999)). Lin and co-workers have used this property to grow double-layer structures, where the first pentacene layer is grown at 70° C. to yield large grains, followed by a growth at 25° C. to fill in the intergrain gaps and increase the film connectivity (see Y. Y. Lin, D. J. Gundlach, T. N. Jackson, S. F. Nelson, *IEEE Trans. On El. Dev.* 44 1325 (1997)). This yielded a mobility as large as 1.5 cm$^2$/V·s for devices where the gate insulator was pre-coated with a self-assembled monolayer ("SAM") of octadecyl-trichlorosilane ("OTS") (see T. N. Jackson, Y. Y. Lin, D. J. Gundlach, H. Klauk, *IEEE J. of Sel. Topics in Quant. Electr.* 4 100 (1998)). Thin film transistors without the SAM exhibited $\mu_{eff}$<0.5 cm$^2$/V·s.

SUMMARY OF THE INVENTION

An object of the present invention is to provide a method of using organic vapor phase deposition to fabricate highly ordered polycrystalline organic thin films, such as, for example, pentacene. According to the method of the present invention, organic vapor phase deposition offers the ability to vary the grain size of polycrystalline organic thin films via both the deposition chamber pressure and the substrate temperature. OVPD proceeds by evaporation of the source material followed by transport by an inert carrier gas toward a cooled substrate, where selective condensation occurs. Both reducing and oxidizing carrier gases may be used in the method of the present invention. This OVPD technique allows for independent control of source evaporation rate, carrier gas flow rate, deposition chamber pressure, and substrate temperature.

The highly ordered polycrystalline organic thin films produced by the method of the present invention may be used in a variety of applications, including OLEDs, photovoltaic cells, photodetectors, lasers, and thin film transistors. For example, thin film transistors employing such polycrystalline organic thin films exhibit competitive performance characteristics, such as carrier mobility, on/off ratio, threshold voltage and subthreshold slope. By varying both the substrate temperature and the deposition chamber pressure during the organic vapor phase deposition process, the performance characteristics of the TFT can be enhanced. For pentacene films deposited at substrate temperatures of $T_s$=20° C. and at deposition chamber pressures of $P_{dep}$=0.25 Torr, the apparent room temperature field-effect hole mobilities range from $\mu_{eff}$=0.01 to 0.2 cm$^2$/V·s for films deposited onto the surface of the source and drain contacts. The mobility increases with channel length, which ranges from 2 μm to 30 μm. Organic film growth at $T_s$=50° C. and $P_{dep}$=8 Torr yields a larger organic crystalline grain size (>5 μm), resulting in a maximum $\mu_{eff}$=0.6 cm$^2$/V·s for source and drain contacts deposited onto the pentacene film surface. For films deposited onto the source and drain contacts at this higher temperature and pressure, however, $\mu_{eff}$=0.002 to 0.05 cm$^2$/V·s, despite having the average crystallite size exceed the smallest channel length. These low apparent $\mu_{eff}$ values are attributed to poor contact due to dewetting at the organic film-metal contact interface. In addition, by increasing the hydrophobic character of the gate insulator-pentacene interface, $\mu_{eff}$, on/off ratios, and subthreshold slope of pentacene channel TFTs can be significantly improved due to the decrease in density and energy of charge traps at the pentacene-oxide interface as a result of the hydrophobic treatment.

DETAILED DESCRIPTION

Figure 1:
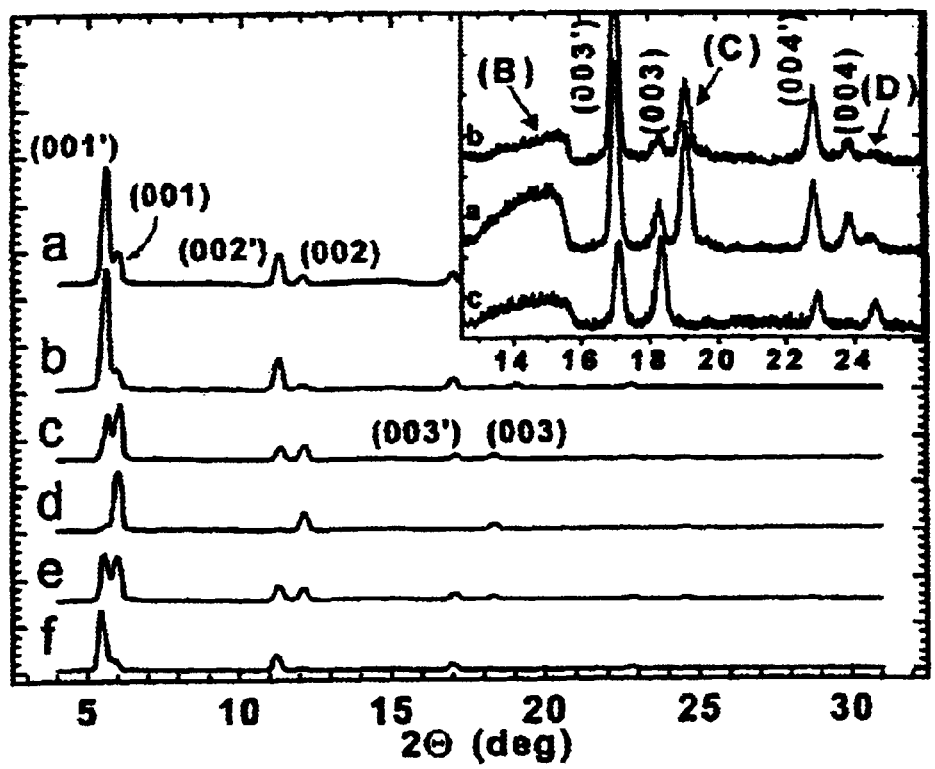
FIG. 1. X-Ray diffraction patterns of pentacene thin films deposited by OVPD on (100) Si (100 referring to cut of the Si wafer relative to the crystallographic plane orientation of Si) and thermally-grown SiO$_2$: a) SiO$_2$, 1000 Å, 40° C., 2 Torr; b) SiO$_2$, 1000 Å, 40° C., 6.2 Torr; c) SiO$_2$, 1200 Å, 10° C., 0.14 Torr; d) Si, 2100 Å, 50° C., 0.14 Torr; e) Si, 2100 Å, 10° C., 0.14 Torr; f) Si, 1000 Å, 10° C., 0.15 Torr; Inset magnifies patterns for samples a, b, and c, showing features (B) and (C) which correlate to high-pressure depositions. Feature (D) appears to be more prominent for low-pressure cases.

The present invention is directed to a method of using organic vapor phase deposition to fabricate polycrystalline organic thin films.

The polycrystalline organic thin films produced according to the method of the present invention can be employed in devices such as, for example, OLEDs, photovoltaic cells, photodetectors, lasers, and TFTs. Thus, the method of the present invention can be used in fabricating such OLEDs, photovoltaic cells, photodetectors, lasers, and TFTs which employ a polycrystalline organic thin film.

The method of the present invention employs organic vapor phase deposition at moderate deposition chamber pressures and substrate temperatures for the deposition of organic polycrystalline films having significantly larger purity and grain size than what is achievable by vacuum thermal evaporation. That is, by employing organic vapor phase deposition, the method of the present invention allows for the fabrication of a polycrystalline organic thin film with a resulting crystallite size on the order of the shortest device dimension. For example, in a horizontal TFT, the crystallite size would be between about 1 and about 10 microns; in a vertical TFT, an OLED and a vertical solar cell, the crystallite size would be between about 500 Å and about 1 micron; in a horizontal solar cell, the crystallite size would be between about 1 and about 100 microns; and in a photodetector, the crystallite size would be between about 5 Å and about 1 micron.

According to the method of the present invention, we have discovered that when employing OVPD to fabricate a polycrystalline organic thin film, for example, of pentacene, at low deposition chamber pressures, P$_{dep}$, (<1 Torr), and low substrate temperatures, T$_s$, (<30° C.), the pentacene grain size is <0.5 $\mu$m, while at higher P$_{dep}$ and T$_s$ (>4 Torr and >50° C., respectively) the pentacene grain diameter can exceed 5 $\mu$m. By varying both the substrate temperature and the deposition chamber pressure during the OVPD process, the performance characteristics of the organic thin film can be enhanced. For example, when the polycrystalline organic thin film serves as the active layer of a TFT, the OVPD process offers the unique advantage of allowing the morphology and electrical characteristics of the pentacene channel to be controlled by varying the deposition chamber pressure and the substrate temperature.

The polycrystalline organic thin film may be comprised of any molecular organic compound, preferably flat, planar, stacking molecular organic compounds. Representative examples of such compounds include porphyrins, triphenyls, $\alpha$-6T, tetracene and pentacene, with pentacene being particularly preferred.

The present invention will now be described in detail for specific preferred embodiments of the invention, it being understood that these embodiments are intended only as illustrative examples and the invention is not to be limited thereto.

Polycrystalline pentacene TFTs using two different contact arrangements were fabricated employing the method of the present invention. In a type I device, 500 Å thick Au source and drain contacts are formed using photolithography on an about 2000 Å thick plasma enhanced chemical vapor deposited ("PECVD") SiN$_x$ gate insulator layer; the (100)-oriented highly n-type doped Si wafer serves as the gate electrode. The pre-patterned substrates are subsequently treated in 100 mTorr O$_2$ plasma for 5 minutes at 50 W, and pentacene is deposited (at 0.1–1 Å/s) by OVPD within 1 hr of the treatment. In a type II device, pentacene was deposited onto a similarly O$_2$ plasma-treated SiN$_x$ gate insulator, followed immediately by vacuum deposition of the Au source and drain contacts through a shadow mask. Type I devices contain 2, 6, 10 and 30 $\mu$m long by 100 $\mu$m wide channels, while the type II devices have 15–40 $\mu$m long by 1000 $\mu$m wide channels.

Figure 5:
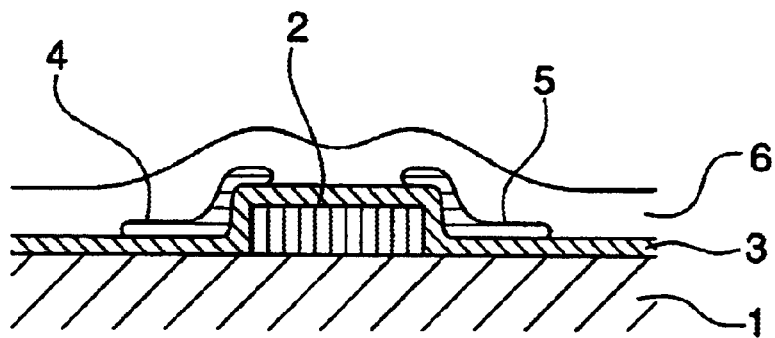
FIG. 5. A schematic diagram of a cross-section of a type I TFT device employing a polycrystalline organic thin film fabricated according to the method of the present invention.

A schematic diagram of a cross-section of a type I device is shown in FIG. 5. As can be seen in FIG. 5, a gate electrode 2 is formed on a substrate 1, and the gate insulating layer 3 is formed over both the gate electrode 2 and the substrate 1. The source contact 4 and drain contact 5 are formed over the gate insulating layer 3, and the polycrystalline organic thin film 6 is formed over the top of the gate insulating layer 3, the source contact 4 and drain contact 5. These layers and contacts are formed by methods known in the art. For instance, the gate electrode can be formed by evaporation of the metal, followed by chemical vapor deposition of the insulator, however other methods known in the art may also be used for such formations.

Materials for use in a TFT are known in the art, and such materials may be used in accordance with the method of the present invention. For instance, the substrate may be comprised of, for example, glass, Al$_2$O$_3$ or Si; the gate electrode may be comprised of, for example, Au or Si; and the organic thin film may be comprised of, for example, pentacene, copper phthalocyanine (CuPc) or 2, 3, 7, 8, 12, 13, 17, 18-octaethyl-21H,23H-porphine platinum(II) (PtOEP).

Figure 6:
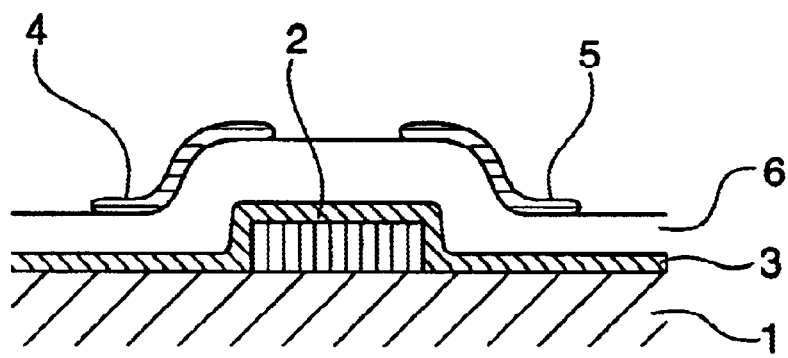
FIG. 6. A schematic diagram of a cross-section of a type II TFT device employing a polycrystalline organic thin film fabricated according to the method of the present invention.

A schematic diagram of a type II device is shown in FIG. 6. As explained above and as can be seen in FIG. 6, the type II device of FIG. 6 differs from the type I device of FIG. 5 in that the source contact 4 and drain contact 5 are deposited on top of the polycrystalline organic thin film 6 in the type II device of FIG. 6.

FIG. 1 shows several x-ray diffraction patterns of pentacene thin films taken on a Rigaku x-ray diffractometer with a Varian™ Cu K-$\alpha$ radiation source. The films were deposited by OVPD on (100) Si and thermally grown SiO$_2$. The diffraction patterns correlate well with those obtained by others (see I. P. M. Bouchoms, W. A. Schoonveld, J. Vrijmoeth, T. M. Klapwijk, *Synth. Met.* 104 175 (1999)) in that they show the triclinic bulk phase with a vertical plane spacing of 14.5 Å, and the so-called thin-film phase with a spacing of 15.5 Å. In addition, several more features are observed: the broad peak labeled (B) at 2$\Theta$=15°, and sharper features (C) at 2$\Theta$=19° and (D) at 2$\Theta$=24.5°. FIG. 1 illustrates that for Si substrates at ~10° C. (FIG. 1(f)), and for film thicknesses <1000 Å, one obtains almost exclusively the thin film phase, which is thought to have a greater $\pi$-overlap in the plane of the substrate than does the bulk phase (see I. P. M. Bouchoms, W. A. Schoonveld, J. Vrijmoeth, T. M. Klapwijk, *Synth. Met.* 104 175 (1999)).

Increasing the pentacene film thickness on Si to 2100 Å (FIG. 1(e)) results in more bulk phase. Increase in the Si substrate temperature from 10° C. (FIG. 1(e)) to 50° C. (FIG. 1(d)) also increases the fraction of bulk phase pentacene. Deposition on SiO$_2$ at 10° C. and 0.14 Torr (FIG. 1(c)) results in a mixture of the (A) and (A') phases, analogous to deposition on Si at 50° C. and 0.14 Torr (FIG. 1(d)). This has also been observed for deposition on SiN$_x$ at similar conditions (not shown), signifying a weaker substrate-pentacene interaction with gate insulator surfaces. When the deposition pressure is increased from 0.14 Torr to 2 and 6 Torr the pentacene is now almost entirely in the thin film phase (A'), as this increased pressure enables the organic molecules to diffuse more quickly through the boundary layer and to the substrate. This is an advantageous feature of OVPD which allows for the deposition of larger grains at higher temperature while preserving the molecular ordering of the thin film phase, potentially leading to an increase in channel conductivity. In view of these x-ray data, it is apparent that all of these channel layer films were deposited in a processing regime that yields a majority of the thin film phase. However, we note that with the hole inversion layer at the channel/insulator interface being only tens of Ångstroms thick and consisting entirely of the thin film phase, the ratio of the two phases does not appear to influence the electrical characteristics of the TFT as much as the pentacene grain size.

Figure 2A:
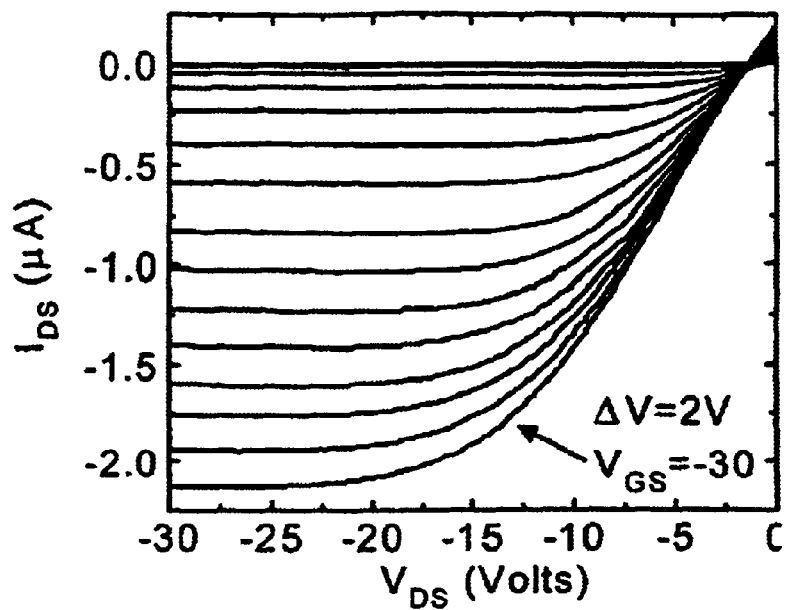
FIG. 2a. Drain-source current ($I_{DS}$) versus drain-source voltage ($V_{DS}$) for different gate biases of a typical OVPD deposited pentacene TFT. The device has a gate width-to-length ratio, W/L=100 μm/10 μm with an active layer consisting of about 500 Å-thick pentacene grown at 0.25 Torr and 10° C. substrate temperature.
Figure 2B:
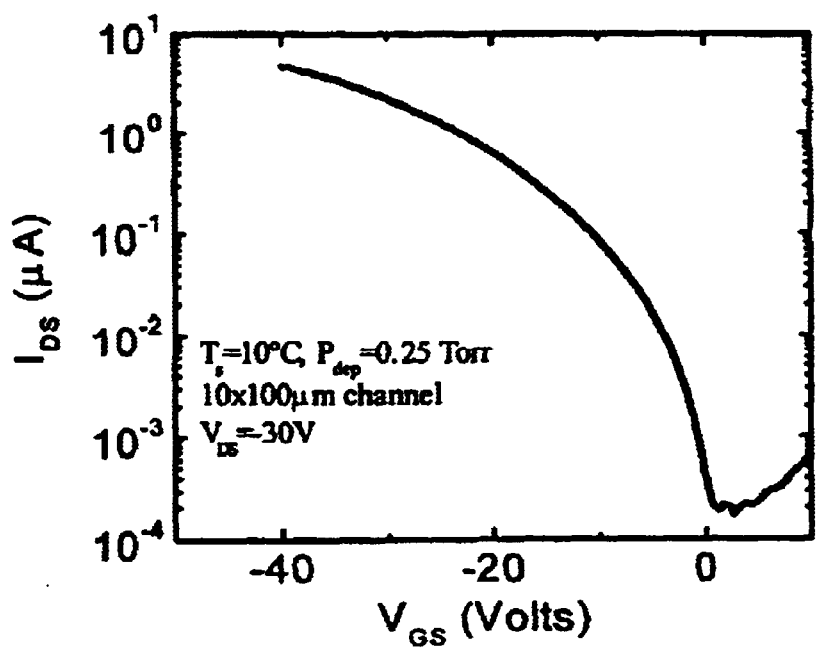
FIG. 2b. $I_{DS}$ versus $V_{GS}$ at $V_{DS}$=−30V for a bottom contact device (i.e., type I device) having channel width and length of 100 and 10 μm, respectively (same device as FIG. 2a). The field-effect mobility is 0.17 cm$^2$/V·s, on/off ratio is >10$^5$, $V_T$=−1.7 V, and the subthreshold slope is 1.6 V/decade.

Typical transfer characteristics of a type I device (10×100 μm channel) are shown in FIGS. 2a and 2b. The pentacene channel was 500 Å thick, deposited at a rate of 1 Å/s using nitrogen at 15 sccm as the carrier gas, at a total chamber pressure of 0.25 Torr and substrate temperature of 10° C. The apparent field-effect mobility, $\mu_{eff}$, is extracted from the transistor saturation regime using the following equation:

$$I_{DS} = -\tfrac{1}{2} \times C_D \times (W/L) \times \mu_{eff} \times (V_{GS} - V_T)^2 \quad (1);$$

where $I_{DS}$ is the drain-source voltage, $C_D$ is the gate capacitance per area of the dielectric, W/L is the channel width to length ratio, and $V_{GS}$ and $V_T$ are the gate-source and threshold voltages, respectively. Note that since both $I_{DS}$ and $V_T$ depend on the contact injection efficiency, $\mu_{eff}$ extracted using Eq. (1) is not an accurate measure of the film mobility itself, but serves as a lumped indicator of ease of hole transport in the device.

Figure 3A:
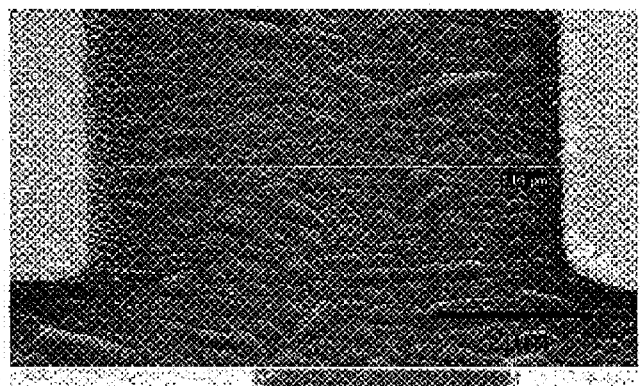
FIG. 3. Scanning electron micrographs of OVPD deposited pentacene TFTs: a) $T_s$=20° C., $P_{dep}$=0.85 Torr; b) $T_s$=20° C., $P_{dep}$=0.85 Torr; c) $T_s$=65° C., $P_{dep}$=8 Torr; d) $T_s$=65° C., $P_{dep}$=8 Torr, top-deposited contacts, as shown in the inset.
Figure 3B:
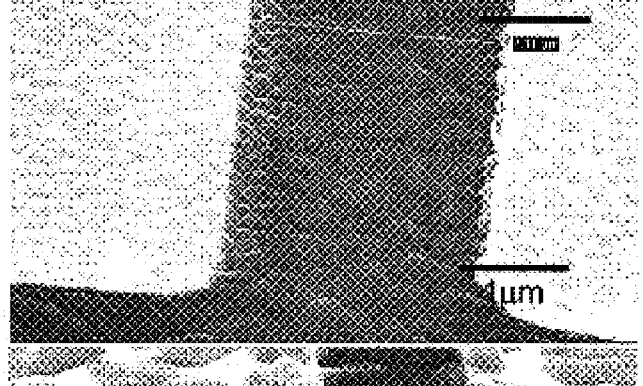

Tested in air, the device in FIGS. 2a and 2b exhibited $\mu_{eff} = (0.10 \pm 0.05)$ cm$^2$/V·s, an $I_{DS}$ on/off ratio >10$^5$, a peak extrinsic transconductance of 0.3 μA/V at $V_{DS} = -30$ V and $V_{DS} = -40$ V, $V_T = -(1.7 \pm 0.1)$ V, and a subthreshold slope of 1.6 V/decade. The average grain size of the pentacene in the channel was about 0.5 μm, as determined by scanning electron microscopy (see FIGS. 3(a) and 3(b)).

Figure 4:
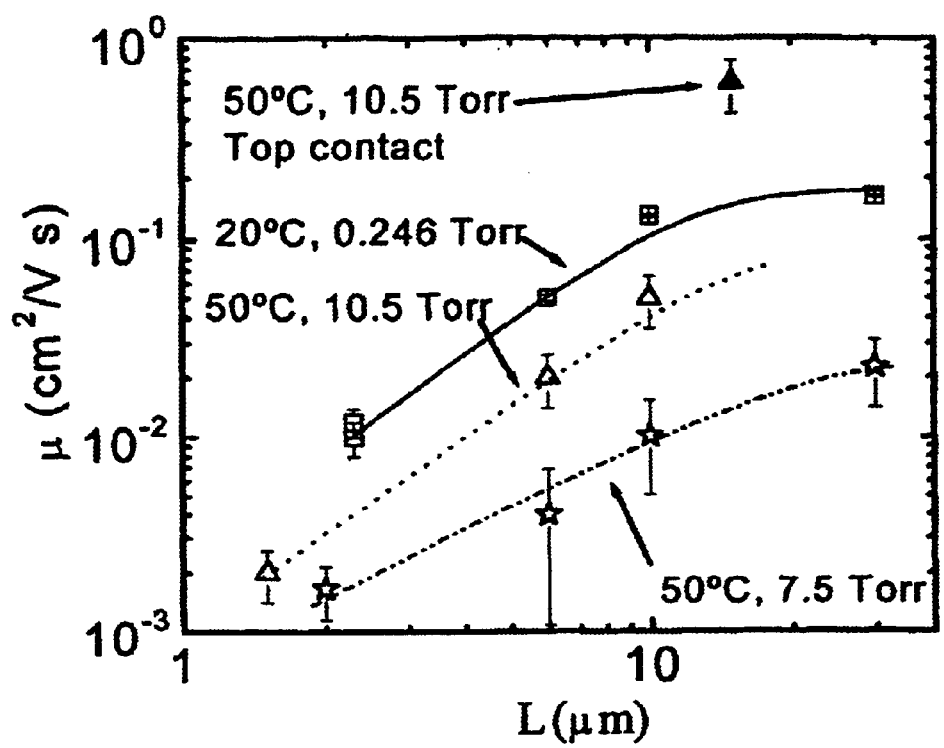
FIG. 4. Apparent effective channel hole mobility, $\mu_{eff}$, versus gate length (L) for a type I TFT with pentacene channel deposited at: $T_s$=20° C. and $P_{dep}$=0.25 Torr (squares); $T_s$=50° C. and $P_{dep}$=10.5 Torr (open triangles); and $T_s$=50° C. and $P_{dep}$=7.5 Torr (open stars) on type I substrates. The effect of using a type II TFT structure, with top-deposited contacts, for high $T_s$ and $P_{dep}$ is also shown (filled triangle). Lines serve only as guides to the eye.

As shown in FIG. 4, the mobility apparently increases with channel length, reaching a constant value for channel lengths exceeding 10 μm. Scanning electron micrographs of type I devices (FIGS. 3(a) and 3(b)) reveal smaller pentacene grains at distances <0.5 μm from the contacts, with larger crystallites further away from the metal edge. The smaller crystallite size at the contact-channel interface leads to an increased density of grain boundaries and charge traps (see C. D. Dimitrakopoulos, D. J. Mascaro, *IBM J. Res. & Dev.* 45 11 (2001)), resulting in a concomitant increase in resistance to carrier transport, and hence an apparent decrease in the apparent $\mu_{eff}$. For longer channels with larger pentacene grains, this boundary effect becomes negligible, and the apparent mobility approaches a constant value for the corresponding crystallite size far away from the contacts.

Figure 3C:
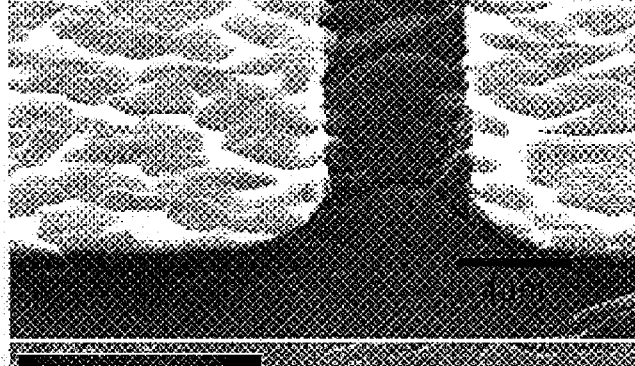
Figure 3D:

To obtain larger pentacene grains, T$_s$ was increased from 20° C. to 50° C., and P$_{dep}$ from 0.25 Torr to 10.5 Torr. However, despite the larger grain size (>1 μm in FIG. 3(c)), $\mu_{eff}$ for a type I device dropped to 0.002 cm$^2$/V·s. On the other hand, in a type II device with top-deposited contacts, $\mu_{eff}$ increased to 0.6 cm$^2$/V·s at P$_{dep}$=10.5 Torr and T=50° C., as shown in FIG. 4. The large difference between $\mu_{eff}$ of type I and type II devices can be understood by comparing FIGS. 3(c) and 3(d), which reveal de-wetting of the gold pads by the pentacene in the type I structure (FIG. 3(c)), leading to poor overlap between the contacts and the organic channel. This increases the contact series resistance, leading to an apparent drop in $\mu_{eff}$. As shown in FIG. 4, decreasing P$_{dep}$ from 10.5 to 7.5 Torr for T$_s$=50° C. leads to a decrease in $\mu_{eff}$ by almost an order of magnitude. This is attributed to a smaller pentacene grain size obtained at lower pressures, coupled with de-wetting of the contacts due to the high substrate temperature. For top-deposited contacts, de-wetting does not occur due to the reversed deposition sequence, and the mobility therefore benefits from the >5 μm average grain size (FIG. 3(d)).

In another embodiment of the present invention, polycrystalline pentacene channel TFTs were fabricated by OVPD of pentacene onto a treated ~2100 Å thick thermal-SiO$_2$ gate insulator at P$_{dep}$=6 Torr and T$_s$=40° C., followed immediately by vacuum thermal evaporation of the Au source and drain contacts through a shadow mask (a type II device). The surface treatments of the SiO$_2$ included: (a) exposure to O$_2$ plasma; (b) plasma followed by baking at 150° C. in air; (c) baking at 150° C. followed by a soak in a 30 μM solution of octadecyltrichlorosilane (OTS) in chloroform and hexane and a 1 hour bake at 150° C. in air; and (d) plasma followed by the OTS step. The treatments (a), (b), (c), and (d) are listed in order of decreasing polar character of the resulting surface, which was determined by comparing the surface wetting angle of water. Treatment (b) simply dehydrates the surface, while treatment (c) enhances that effect by assembling a surfactant on the SiO$_2$ surface with the hydrophobic tails pointing away from the substrate. Plasma treatment results in a very polar oxide surface, which enhances the assembly of the polarheaded OTS, resulting in the end to a more hydrophobic surface that (c).

The OTS treatment involves dissolving octadecyltrichlorosilane in a mixture of polar and non-polar solvents (chloroform and hexanes, respectively) and soaking the SiO$_2$ wafer in this solution for several minutes to several hours. During the soak, micelles of OTS land and unfold on the oxide surface, while the chlorine in the original OTS molecule is displaced by oxygen from water to cross-link the individual OTS molecules. Following the soak, the wafer is sonicated for 20 minutes in chloroform to remove excess OTS, after which it can be baked at 150° C. for 1 hour to further strengthen the OTS-OTS and OTS-SiO$_2$ bond.

Figure 7:
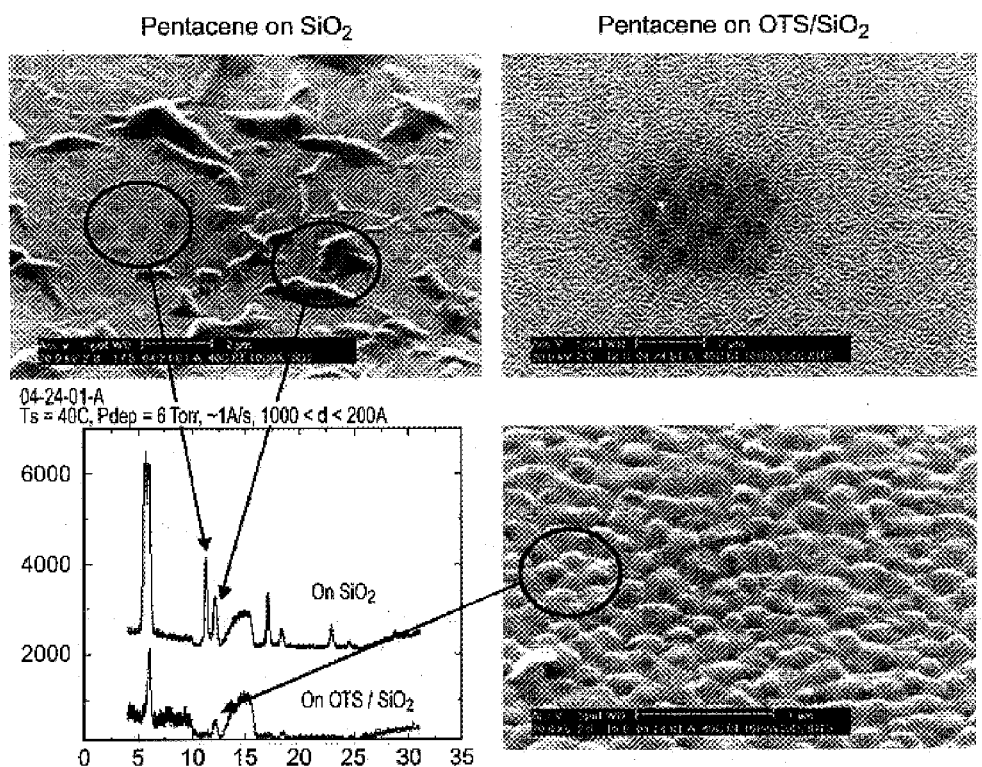
FIG. 7. X-Ray diffraction patterns of pentacene thin films deposited by OVPD on thermally-grown SiO$_2$ and OTS-treated SiO$_2$, with corresponding SEM images. Pentacene was deposited at T$_s$=40° C. and P$_{dep}$=6 Torr.

FIG. 7 shows x-ray diffraction patterns of OVPD pentacene on SiO$_2$ and on OTS-treated SiO$_2$, as well as scanning electron micrographs (SEMs) of the corresponding pentacene films. Pentacene is observed to grow in smaller grains on OTS than on SiO$_2$, indicating a stronger interaction with the substrate in the former case.

Figure 8:
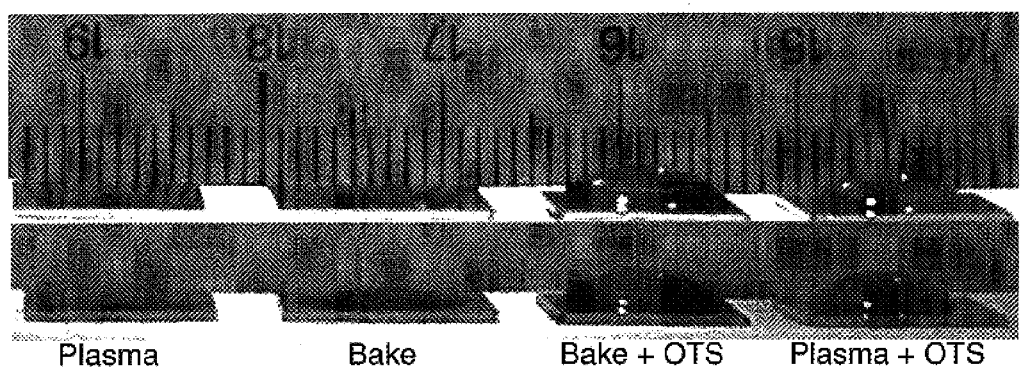
FIG. 8. Photograph of water droplets on the treated SiO$_2$ substrates. The surface treatments were, from left to right: (a) O$_2$ plasma; (b) O$_2$ plasma+Bake @ 150° C.; (c) O$_2$ plasma+Bake+OTS; (d) O$_2$ plasma+OTS.

FIG. 8 shows a photograph of water droplets on the treated SiO$_2$ substrates. The surface treatments were, from left to right: (a) exposure to O$_2$ plasma; (b) plasma followed by baking at 150° C.; (c) plasma followed by baking at 150° C. followed by a soak in an OTS solution; and (d) plasma followed by OTS treatment. The polar character of the resulting surface was determined by the wetting angle of water.

Figure 9A:
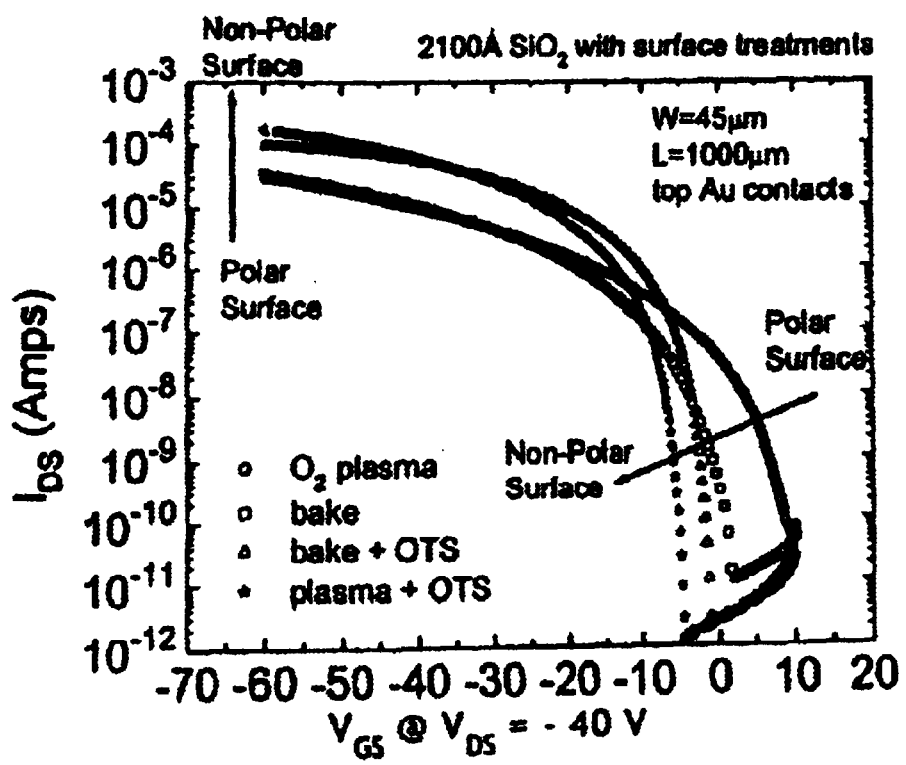
FIG. 9a. Drain-source current (I$_{DS}$) versus gate-source voltage (V$_{GS}$) for OVPD deposited pentacene TFT having various SiO$_2$ surface treatments. All of the devices had a gate width-to-length ratio, W/L=1000 $\mu$m/45 $\mu$m with an active layer consisting of ~500 Å thick pentacene grown at 6 Torr and 40° C. substrate temperature.

FIG. 9(a) plots $I_{DS}$ against $V_{GS}$ at $V_{DS}=-40$ volts for the TFTs with the different surface treatments. The "on" current increase with hydrophobicity of the SiO$_2$-pentacene interface spans one order of magnitude, accompanied by an order of magnitude decrease in the "off" current. Changes in the source-drain current are accompanied by an increase in $\mu_{eff}$ and the on/off ratio, as shown below in Table 1, while the subthreshold slope, $m_{st}$, (in volts/decade) decreases. The decrease in $m_{st}$ may be attributed to the lower number of surface dipoles in the hydrophobically treated samples, which can result from the oxygenating treatment of the gate dielectric and can increase charge trap density and/or energy at the pentacene-oxide interface. When the baking step is omitted after the OTS treatment, $\mu_{eff}$ is higher, reaching 1.4 cm$^2$V·s for freshly purified pentacene, as indicated below in Table 1. Interestingly, when O$_2$ plasma-treated SiN$_x$, is used as the gate dielectric in pentacene channel TFTs, $\mu_{eff}$ has been higher than in the case of SiO$_2$. Previous x-ray and SEM studies (see T. N. Jackson, et al., *IEEE J of Sel. Topics in Quant. Electr.*, 4: 100 (1998)) of organic vapor phase deposited pentacene on SiO$_2$ and SiN$_x$ suggest that the pentacene-SiN$_x$ interaction is weaker than that in pentacene-SiO$_2$ (and weaker still than pentacene-OTS), leading to improved organic layer ordering, larger crystallites and hence higher $\mu_{eff}$ with the SiN$_x$ insulator. Certainly in the case of SiN$_x$ gate dielectric, the pentacene deposition conditions used herein yield larger grains (>2 $\mu$m compared to <0.5 $\mu$m on OTS, see FIG. 7), which explain the relatively high $\mu_{eff}$ in the absence of OTS.

Figure 9B:
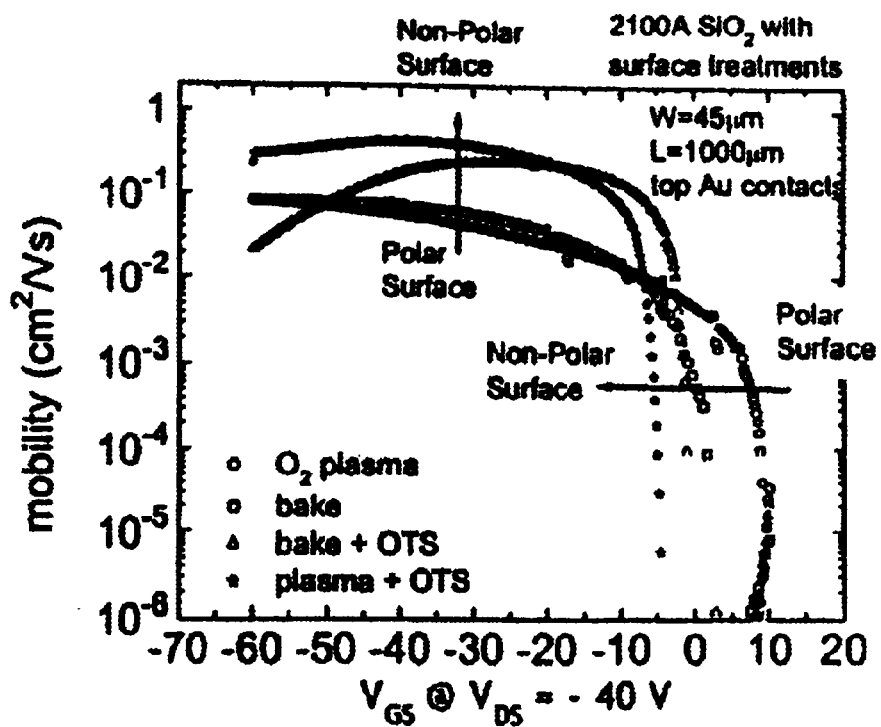
FIG. 9b. Field-effect hole mobility, $\mu_{eff}$, versus V$_{GS}$ at V$_{DS}$=−40V for the device in FIG. 9a. The mobility values listed in Table 1 are peak values taken from this plot.

As shown in FIG. 9(b), the effective field-effect hole mobility, $\mu_{eff}$, in organic vapor phase deposited pentacene channel TFTs increases with the non-polar character of the gate dielectric-pentacene interface.

Figure 10:
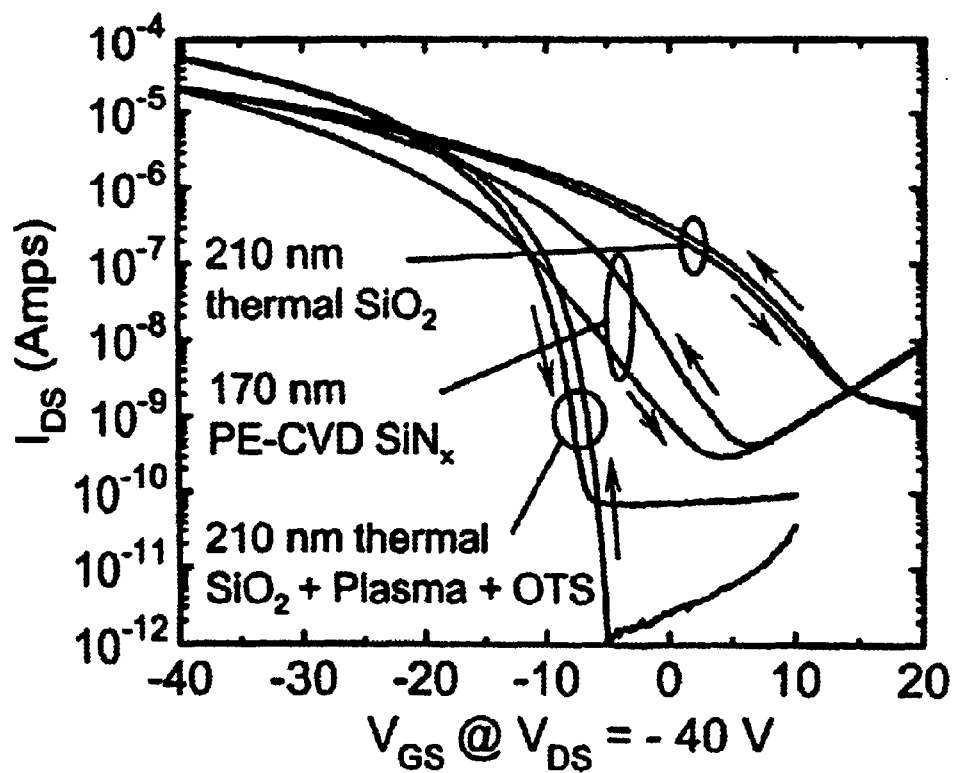
FIG. 10. Plot of I$_{DS}$ versus V$_{GS}$ for pentacene channel TFTs on SiN$_x$, SiO$_2$, and OTS-treated SiO$_2$, illustrating the hysterisis due to charge trapping. Pentacene was deposited at T$_s$=40° C. and P$_{dep}$=6 Torr.

No clear trend was observed for V$_T$ (see Table 1 below). Since the pentacene deposition for the first four samples in Table 1 was carried out simultaneously, and the substrates were taken from a single SiO$_2$ on Si wafer, V$_T$ does not seem to be a bulk property of pentacene nor of gate insulator. There was a small but significant variability in V$_T$, on/off ratio, and $\mu_{eff}$ (<30%) of pentacene-channel TFTs from different pentacene runs, as well as hysterisis in I$_{DS}$ vs. V$_{GS}$ scans. FIG. 10 shows that in the "forward" scan direction (from positive V$_{GS}$ to negative V$_{GS}$) I$_{DS}$ is greater than on the return path. The difference is attributable to charge trapping at the pentacene-oxide interface. When a significant charge density is produced at the interface during the forward scan, it takes a larger electric field to reverse the polarity if the charges must de-trap from that interface. As FIG. 10 indicates, the OTS-treated TFTs exhibit less severe I$_{DS}$ hysterisis than the O$_2$-plasma-treated SiO$_2$ and SiN$_x$, although the on/off behavior is opposite of that.

TABLE 1

| SiO$_2$ surface treatment preceding OVPD of pentacene at T$_s$ = 40° C., P$_{dep}$ = 6 Torr | $\mu_{eff}$ (cm$^2$/Vs) | On/Off | V$_T$ (Volts) | Sub-threshold slope (m$_{st}$) (Volts/Decade) |
|---|---|---|---|---|
| 1) O$_2$ Plasma | 0.080[a] | 5.3 10$^5$ | −15.0 | −2.0 |
| 2) Bake @ 150° C. for 1 hour | 0.083[a] | 3.0 10$^6$ | −15.3 | −1.3 |
| 3) Bake @ 150° C. for 1 hour + OTS + Bake @ 150° C. for 1 hour | 0.24[a] | 4.4 10$^7$ | −6.7 | −0.65 |
| 4) O$_2$ Plasma + OTS + Bake @ 150° C. for 1 hour | 0.43[a] | 1.3 10$^8$ | −13.4 | −0.60 |
| 5) O$_2$ Plasma + OTS + bake @ 150° C. | 0.55[b] | 4.7 10$^7$ | −8.3 | 0.91 |
| 6) O$_2$ Plasma + OTS | 0.88[b] | 8.0 10$^7$ | −11.7 | 0.43 |
| 7) 2100Å SiN$_x$ + O$_2$ Plasma | 0.2[c] | 7.0 10$^5$ | −8.0 | −3.7 |
| 8) O$_2$ Plasma + OTS | 1.4[d] | 1.1 10$^8$ | −11.4 | −0.82 |

[a] Pentacene purified twice by vacuum train sublimation but stored for 3 months under vacuum at room temperature. Channel length, L = 45 $\mu$m.
[b] Pentacene purified twice by vacuum train sublimation. Channel length, L = 50 $\mu$m.
[c] Plasma-enhanced chemical vapor deposited SiN$_x$ was used as the gate dielectric in this pentacene channel TFT (see T.N. Jackson, et al., IEEE J of Sel. Topics in Quant. Electr., 4: 100 (1998)). Channel length, L = 45 $\mu$m.
[d] Pentacene purified twice by vacuum train sublimation and used immediately after. Channel length, L = 50 $\mu$m.

What is claimed is:

1. A method of fabricating a polycrystalline organic thin film, said method comprising:
   depositing a polycrystalline organic thin film on a substrate by organic vapor phase deposition, wherein the organic vapor phase deposition occurs at a substrate temperature in the range of 2° C. to 77° C., and at a deposition chamber pressure in the range of 0.05 Torr to 760 Torr.

2. The method of claim 1, wherein the organic vapor phase deposition occurs at a substrate temperature in the range of 10° C. to 65° C., and at a deposition chamber pressure in the range of 0.14 to 10.5 Torr.

3. The method of claim 1, wherein the polycrystalline organic thin film comprises a member selected from the group consisting of α-6T, tetracene and pentacene.

4. The method of claim 1, wherein the polycrystalline organic thin film comprises pentacene.

5. The method of claim 4, wherein the polycrystalline organic thin film has a grain diameter of at least 5 $\mu$m.

6. A method of fabricating a polycrystalline organic thin film, said method comprising:
   depositing a polycrystalline organic thin film on a substrate by organic vapor phase deposition at a deposition chamber pressure P, wherein the deposition chamber pressure P is selected to control the grain size of the polycrystalline organic thin film.

7. The method of claim 6, wherein the deposition chamber pressure P is in the range of 0.05 Torr to 760 Torr.

8. The method of claim 7, wherein the deposition chamber pressure P is in the range of 0.14 Torr to 10.5 Torr.

9. The method of claim 6, wherein the polycrystalline organic thin film comprises a member selected from the group consisting of α-6T, tetracene and pentacene.

10. The method of claim 6, wherein the polycrystalline organic thin film comprises pentacene.

11. The method of claim 10, wherein the grain size is at least 5 $\mu$m.

12. A method of fabricating a polycrystalline organic thin film, said method comprising:
   depositing a polycrystalline organic thin film on a substrate by organic vapor phase deposition at a deposition chamber pressure P and a substrate temperature T, wherein the deposition chamber pressure P and the substrate temperature T are selected to control the grain size of the polycrystalline organic thin film.

13. The method of claim 12, wherein the deposition chamber pressure P is in the range of 0.05 Torr to 760 Torr, and the substrate temperature T is in the range of 2° C. to 77° C.

14. The method of claim 13, wherein the deposition chamber pressure P is in the range of 0.14 Torr to 10.5 Torr, and the substrate temperature T is in the range of 10° C. to 65° C.

15. The method of claim 12, wherein the polycrystalline organic thin film comprises a member selected from the group consisting of α-6T, tetracene and pentacene.

16. The method of claim 12, wherein the polycrystalline organic thin film comprises pentacene.

17. The method of claim 16, wherein the grain size is at least 5 μm.

18. A method of fabricating an organic light emitting device, said method including the method of claim 1.

19. A method of fabricating a laser, said method including the method of claim 1.

20. A method of fabricating a photovoltaic cell, said method including the method of claim 1.

21. A method of fabricating an organic thin film transistor, said method comprising:

forming a gate electrode on a substrate;

forming a gate insulating layer on the gate electrode and on the substrate;

forming a source contact and a drain contact on the gate insulating layer by photolithography, thereby forming a pre-patterned substrate; and depositing a polycrystalline organic thin film on the pre-patterned substrate by organic vapor phase deposition, wherein the organic vapor phase deposition occurs at a substrate temperature in the range of 2° C. to 77° C., and at a deposition chamber pressure in the range of 0.05 Torr to 760 Torr.

22. The method of claim 21, wherein the organic vapor phase deposition occurs at a substrate temperature in the range of 2° C. to 77° C., and at a deposition chamber pressure in the range of 0.05 Torr to 760 Torr.

23. The method of claim 22, wherein the organic vapor phase deposition occurs at a substrate temperature in the range of 10° C. to 65° C., and at a deposition chamber pressure in the range of 0.14 to 10.5 Torr.

24. The method of claim 21, wherein the polycrystalline organic thin film comprises a member selected from the group consisting of α-6T, tetracene and pentacene.

25. The method of claim 21, wherein the polycrystalline organic thin film comprises pentacene.

26. The method of claim 25, wherein the polycrystalline organic thin film has a grain size of at least 5 μm.

27. The method of claim 21, wherein the gate insulating layer comprises $SiN_x$ in a thickness of about 2000 Å, and wherein the gate electrode comprises (100)-oriented highly n-type doped Si.

28. The method of claim 21, wherein the source contact and the drain contact each comprise Au in a thickness of about 500 Å.

29. The method of claim 28, wherein the pre-patterned substrate is treated in 100 mTorr $O_2$ plasma for about 5 minutes at 50 W.

30. The method of claim 21, wherein the thin film transistor has an effective channel hole mobility, $\mu_{eff}$, equal to at least 0.2 cm²/V·s.

31. A method of fabricating an organic thin film transistor, said method comprising:

forming a gate electrode on a substrate;

forming a gate insulating layer on the gate electrode and on the substrate;

depositing a polycrystalline organic thin film on the gate insulating layer by organic vapor phase deposition, wherein the organic vapor phase deposition occurs at a substrate temperature in the range of 2° C. to 77° C., and at a deposition chamber pressure in the range of 0.05 Torr to 760 Torr; and forming a source contact and a drain contact on the polycrystalline organic thin film by vacuum deposition through a shadow mask.

32. The method of claim 31, further comprising treating the gate insulating layer with $O_2$ plasma before depositing the polycrystalline organic thin film.

33. The method of claim 31, wherein the organic vapor phase deposition occurs at a substrate temperature in the range of 10° C. to 65° C., and at a deposition chamber pressure in the range of 0.14 to 10.5 Torr.

34. The method of claim 31, wherein the polycrystalline organic thin film comprises a member selected from the group consisting of α-6T, tetracene and pentacene.

35. The method of claim 31, wherein the polycrystalline organic thin film comprises pentacene.

36. The method of claim 35, wherein the polycrystalline organic thin film has a grain size of at least 5 μm.

37. The method of claim 31, wherein the gate insulating layer comprises $SiN_x$ in a thickness of about 2000 Å, and wherein the gate electrode comprises (100)-oriented highly n-type doped Si.

38. The method of claim 31, wherein the source contact and the drain contact each comprise Au in a thickness of about 500 Å.

39. The method of claim 32, wherein the gate insulating layer is treated in 100 mTorr $O_2$ plasma for about 5 minutes at 50 W.

40. The method of claim 31, wherein the thin film transistor has an effective channel hole mobility, $\mu_{eff}$, equal to at least 0.6 cm²/V·s.

41. A method of fabricating an organic thin film transistor, said method comprising:

forming a gate electrode on a substrate;

forming a gate insulating layer on the gate electrode and on the substrate;

treating the gate insulating layer with $O_2$ plasma;

soaking the gate insulating layer in a solution of octadecyltrichlorosilane dissolved in a mixture of polar and non-polar solvents;

depositing a polycrystalline organic thin film on the gate insulating layer by organic vapor phase deposition, wherein the organic vapor phase deposition occurs at a substrate temperature in the range of 2° C. to 77° C., and at a deposition chamber pressure in the range of 0.05 Torr to 760 Torr; and forming a source contact and a drain contact on the polycrystalline organic thin film by vacuum deposition through a shadow mask.

42. The method of claim 41, wherein the organic vapor phase deposition occurs at a substrate temperature of 40° C., and at a deposition chamber pressure of 6 Torr.

43. The method of claim 41, wherein the polycrystalline organic thin film comprises pentacene.

44. The method of claim 41, wherein the gate insulating layer comprises $SiO_2$ in a thickness of about 2100 Å.

45. The method of claim 41, wherein the gate insulating layer is treated in 100 mTorr $O_2$ plasma for about 5 minutes at 50 W.

46. The method of claim 41, wherein the gate insulating layer is soaked in a 30 μM solution of octadecyltrichlorosilane in chloroform and hexane.

47. The method of claim 41, wherein the thin film transistor has an effective channel hole mobility, $\mu_{eff}$, equal to at least 1.4 cm²/V·s.

* * * * *